United States Patent [19]

Castro

[11] 4,374,678

[45] Feb. 22, 1983

[54] PROCESS FOR FORMING HGCOTE ALLOYS SELECTIVELY BY IR ILLUMINATION

[75] Inventor: Carlos A. Castro, Garland, Tex.

[73] Assignee: Texas Instruments Incorporated, Dallas, Tex.

[21] Appl. No.: 269,292

[22] Filed: Jun. 1, 1981

[51] Int. Cl.³ .................. H01L 21/42; H01L 21/423; H01L 21/36

[52] U.S. Cl. ..................... 148/1.5; 148/174; 148/175; 156/604; 156/DIG. 72; 219/121 LF; 357/16

[58] Field of Search ............ 75/134 H, 151, 169, 75/135; 148/1.5, 13, 13.1, 127, 179, 175, 174; 29/572; 427/53.1; 156/604, DIG. 72; 357/11, 30, 16; 219/121 L, 121 LC, 121 LD, 121 LE, 121 LF, 121 LM

[56] References Cited

U.S. PATENT DOCUMENTS

| | | | |
|---|---|---|---|
| 2,953,690 | 9/1960 | Lawson et al. ............... | 75/169 X |
| 3,424,890 | 1/1969 | Ruyven .................... | 219/121 LD |
| 3,514,347 | 5/1970 | Fumeron et al. ........... | 75/134 H X |
| 3,723,190 | 3/1973 | Kruse et al. ............... | 75/169 X |

*Primary Examiner*—L. Dewayne Rutledge
*Assistant Examiner*—Alan E. Schiavelli
*Attorney, Agent, or Firm*—Robert Groover, III; Melvin Sharp; James T. Comfort

[57] ABSTRACT

A HgCdTe film is produced on a CdTe substrate, by depositing HgTe on a CdTe substrate, and then illuminating the substrate from the underside with infrared light at a wavelength longer than the desired operating wavelength (band-gap-equivalent wavelength) of the device. Since CdTe is transparent in the infrared, the light will reach the HgTe/CdTe interface. Since HgTe is an absorber in the infrared, most of the infrared radiation will be absorbed near the interface, which will cause intense localized heating and thus accelerate the interdiffusion of HgTe and CdTe. This interdiffusion will have the effect of moving the interface away from the original location, and toward the film/air interface. Since the desired end-product HgCdTe composition will be transparent to the infrared radiation applied, the process is inherently self-limiting. By appropriately selecting the infrared wavelength applied, variously proportioned HgCdTe compositions may be obtained, so that the effective band gap of the device can be selected at will. Moreover, no surface damage is caused by this technique.

13 Claims, 8 Drawing Figures

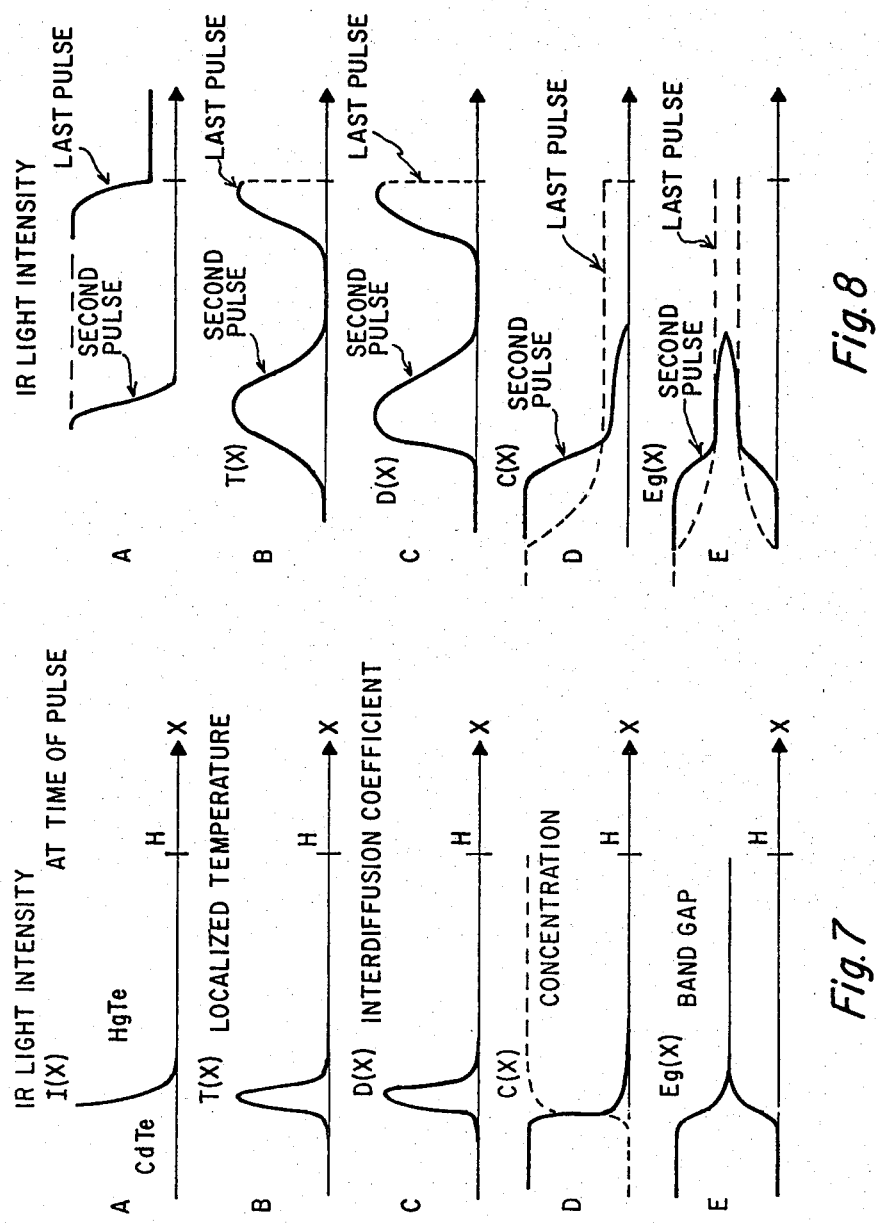

PROCESS FOR FORMING HGCDTE ALLOYS SELECTIVELY BY IR ILLUMINATION

BACKGROUND OF THE INVENTION

Alloys of mercury, cadmium and tellurium are well known to be highly useful in fabricating infrared detectors.

Since HgTe is a semimetal (having a very small negative band gap), and CdTe has a band gap of about 1.5 eV, compositions having an extremely small and arbitrarily selectable band gap may be specified simply by varying the proportions of an alloy having the composition $Hg_{1-x}Cd_xTe$. Such alloys are here referred to generically as "HgCdTe". For example, the composition $Hg_{0.8}Cd_{0.2}Te$ is a 10 micron material, that is, a composition having a bandgap approximately equal to the photon energy of infrared light having a wavelength of 10 microns. By reducing the percentage of cadmium, compositions having a smaller band gap, and therefore a longer operating wavelength, may be produced.

Applications for such a semiconductor, having a small and arbitrarily selectable bandgap, are numerous. However, since the band gap varies with the composition, it is necessary for many applications that the composition of the alloy be uniform. In addition, it is of course necessary, for use in photodetectors, to provide materials which are relatively free of physical defects. Unfortunately, the characteristics of the HgCdTe system make preparation of such alloys difficult. In particular, it is highly desirable to provide an infrared detector operating at a wavelength of 12 microns or longer. Although HgCdTe alloys are transparent down to wavelengths in the 30 micron range, it has heretofore not been practicable to reliably fabricate HgCdTe alloys for operation at wavelengths significantly longer than 10 microns.

Heretofore long wavelength detectors have also been fabricated using doped simiconductors, such as silicon. With such material, the energy states provided by the dopants within the bandgap are used to provide a small transition energy, and therefore a long-wavelength absorption. However, intrinsic long-wavelength detectors are more efficient, and have much more definite frequency characteristics, than such doped materials. The present invention aims at providing an intrinsic long-wavelength detector, which has heretofore not been practicable to provide.

As discussed in U.S. Pat. No. 3,656,944, which is hereby incorporated by reference, a uniform mixture of mercury, cadmium and tellurium is usually achieved by preparing them as a homogenous liquid mixture. However, if such a mixture is cooled slowly, the solid which freezes out will have a progressively varying composition. To avoid these differential freezing effects, one method which has been attempted in the art is to quench a homogenous liquid mixture. However, two further difficulties arise in such a quenching process. First, as with most quenching processes where the solid state is significantly denser than the liquid state, the contraction of the liquid mixture as it solidifies is likely to cause formation of voids and "pipes" (that is, longitudinal voids near the center of a cylindrical body). Second, due to the very high vapor pressure of mercury at all temperatures of interest, it is difficult to prevent mercury from escaping from the solidus-liquidus mixture into any adjacent vacant space, including voids which may be created during the freezing of the mixture. U.S. Pat. No. 3,656,944 discusses ways to minimize this escape of mercury, but the method disclosed by this patent still permits significant inhomogeneity to remain in the alloy produced, and the imprecision of this method also does not permit full exploitation of the advantages which may be obtained, as discussed above, from selecting the band gap of the material produced by controlling the exact composition of the alloy used. Other methods of making HgCdTe have also not succeeded in attaining good yield rates.

Vapor phase epitaxy of HgCdTe has also been attempted, but this approach may result in a graded composition, and is believed not to provide the advantages of the present invention. See Becla, "A Modified Approach to Isothermal Growth of Ultrahigh Quality HgCdTe for Infrared Applications", forthcoming in *J. Electrochemical Soc.*

A further problem with present methods of HgCdTe production is that the area of the photodetector which can be produced is limited by the maximum single-crystal size which can be provided. Since the largest single-crystal size which is currently practical in production quantities is on the order of one inch square, this places a drastic size limitation on present HgCdTe detectors.

General references on the properties of CdTe and HgTe, and of certain other analogous ternary and quaternary systems, may be found in K. Zanio, 13 *Semiconductors and Semimetals* (1978), especially at pages 212 and following; and Harmon, "Properties of Mercury Chalcogenides", in *Physics and Chemistry of II-VI Compounds* (ed. M. Aven & J. Prener, 1967); all of which are hereby incorporated by reference.

It is also frequently desirable to be able to detect the infrared spectrum of a distant object. One method for doing this is to image the same object on different detectors, each operating at different wavelengths. However, such a system requires precise optical calibration and adjustment, and, to resist decollimation, such a system must be made relatively bulky and heavy. Thus, it would be highly desirable to provide an infrared detector which could directly detect more than one wavelength on a single substrate.

It is an object of the present invention to provide HgCdTe devices suitable for use as photodetectors. It is a further object of the present invention to provide HgCdTe films suitable for use as photodetectors.

It is a further object of the present invention to provide HgCdTe devices, suitable for use as photodetectors, which have a very low density of material defects.

It is a further object of the present invention to provide HgCdTe films, suitable for use as photodetectors, which have extremely homogeneous composition.

It is a further object of the present invention to provide a method for producing HgCdTe films whereby the exact composition of the final alloy may be accurately preselected.

It is a further object of the present invention to provide HgCdTe devices, suitable for use as photodetectors, which have extremely flat surfaces.

It is a further object of the present invention to provide HgCdTe films, suitable for use as photodetectors, which have a very large area. It is a particular object of the present invention to provide HgCdTe films, suitable for use as photodetectors, which have an area significantly larger than one square inch.

It is a further object of the present invention to provide HgCdTe films, suitable for use as photodetectors, which have an extremely low density of surface defects.

It is a further object of the present invention to provide a process for manufacturing HgCdTe devices which provides an extremely high yield of satisfactory devices (i.e., number of satisfactory devices as a percentage of total devices).

It is a further object of the present invention to provide a method for manufacturing HgCdTe devices, in which the yield rate is relatively insensitive to variation in parameters in the manufacturing process.

It is a further object of the present invention to provide a process for manufacturing HgCdTe devices which does not require precise control of all manufacturing process parameters.

It is a further object of the present invention to provide a process for manufacturing HgCdTe devices which includes self-limiting steps, so that the manufacturing process achieves no further effect on the device being manufactured, once the desired end product stage has been achieved.

It is a further object of the present invention to provide HgCdTe devices for detection of very long wavelength light.

It is a further object of the present invention to provide HgCdTe devices for detection of light at wavelengths longer than 12 microns.

It is a further object of the present invention to provide HgCdTe structures having a uniform and extremely small non-zero band gap.

It is a further object of the present invention to provide a method for producing uniform films of an intrinsic semiconductor having an extremely small non-zero band gap.

It is a further object of the present invention to provide a method for producing HgCdTe films wherein first portions have a band gap corresponding to a first wavelength and second portions have a band gap corresponding to a second wavelength.

It is a further object of the present invention to provide a monolithic HgCdTe film for multi-color infrared imaging.

SUMMARY OF THE INVENTION

According to the present invention, there is provided a process for forming an alloy of mercury, cadmium, and tellurium, having a desired band gap, comprising the steps of: providing a CdTe substrate; depositing a layer of HgTe on the CdTe substrate; illuminating the CdTe substrate, from a surface of the CdTe substrate on which the layer of HgTe was not deposited, with infrared light having a wavelength longer than that which corresponds to the band gap of the desired alloy of mercury, cadmium, and tellurium which is to be attained.

The present invention achieves the above objects and others, by means of a process in which a HgTe layer is deposited by known methods on a CdTe substrate. The substrate is then illuminated by long-wavelength infrared radiation from behind. Since CdTe is transparent in the infrared, the IR radiation will reach the HgTe/CdTe interface. HgTe is an absorber in the infrared, so that most of the infrared radiation will be absorbed near the HgTe/CdTe interface, which will cause intense local heating at the interface. This intense localized heating will enhance the interdiffusion of the HgTe and CdTe. Since the diffusion rate of Cd in HgTe at the temperatures of interest is higher than that of mercury in CdTe, the interface will in effect be moved away from the original location and toward the film/air interface. Since a HgCdTe composition which has a larger band gap than the energy of the IR illumination will be transparent to the wavelength of the IR illumination, the region of localized heating will gradually move, as the interdiffusion progresses, toward the film/air interface. Thus, a trail of HgCdTe with band gap slightly larger than that corresponding to the wavelength used will be left behind, while the region where the IR illumination is absorbed will move closer and closer to the film/air interface. When a HgCdTe composition having a sufficiently large band gap to be transparent to the IR illumination used reaches the surface, the process will automatically stop, since the whole device is now transparent to the IR illumination used. Thermal relaxation will cause a slight additional interdiffusion to occur, so that the longest absorption wavelength of the HgCdTe composition at the surface of the device, once the process is finished, will be somewhat shorter than the wavelength of the IR illumination used. Since the wavelength of the IR illumination used controls the band gap of the final composition achieved, the preferred embodiment uses an IR laser to provide the long-wavelength source of IR illumination. However, it is believed that a broader-spectrum IR light source could also be used successfully.

Thus, in addition to the objects of the invention summarized above, the preferred embodiments of the present invention provide at least the following crucial advantages: (1) the process is self-limiting, in the sense that, once a HgCdTe composition corresponding to the desired band gap has been achieved, further application of the process will not affect the system. This is a substantial asset in a manufacturing environment. (2) By varying the wavelength of IR illumination, it is possible to obtain different HgCdTe compositions (i.e., different band gap semiconductor compositions) using the same starting material. In other words, various compositions, each tailored to a specific application, can be provided using essentially the same manufacturing process. (3) Since the IR illumination is provided through the substrate, no surface damage occurs.

According to a further embodiment of the present invention, the process for manufacturing an alloy of mercury, cadmium, and tellurium having a composition corresponding to a desired band gap further comprises the additional step of: illuminating said CdTe substrate again, at a second IR wavelength which is shorter than the wavelength of the first IR illumination but is longer than the wavelength corresponding to the band gap of the desired alloy of mercury, cadmium and tellurium which is to be attained, the second illuminating step being performed after the first illuminating step.

A further advantage of the present invention is that the localized heating produced causes desirable annealing effects, particularly near the surface of the device, such as reduction of small-angle grain boundaries. Thus, carrier trapping is reduced and conductivity is improved.

BRIEF DESCRIPTION OF THE DRAWINGS

The present invention will now be described with reference to the accompanying drawings wherein:

FIGS. 7a–7e are graphs showing IR light intensity, localized temperature, interdiffusion coefficient, concentration of cadmium, and band gap, respectively, when a first pulse of infrared illumination is applied to a structure as shown in FIG. 2; and FIGS. 8a–8e are graphs respectively showing IR light intensity, localized temperature, interdiffusion coefficients, concentration of cadmium, and band gap, at the time of the second and of the final pulses applied to the device of FIG. 2, in applying the present invention.

DESCRIPTION OF THE PREFERRED EMBODIMENTS

Figure 1:
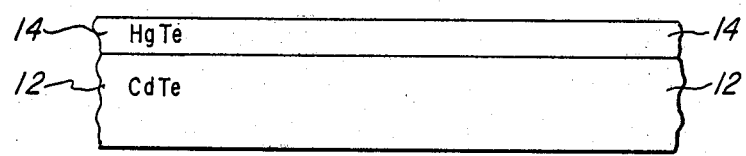
FIG. 1 shows a section of a CdTe substrate, on which a HgTe epitaxial layer has been deposited.

To prepare a device according to the present invention, a CdTe substrate is first provided. The CdTe substrate may be prepared according to a conventional process such as, for example, Bridgman growth. A film of HgTe is then deposited on the CdTe substrate, by a conventional process such as vapor phase epitaxy. Growth of HgTe on a CdTe substrate is shown by publications such as, for example, Kuech & McCaldin, "Low-Temperature CVD Growth of Epitaxial HgTe on CdTe", submitted to *J. Electrochemical Soc.;* and Cohen-Solal et al, "Croissance Epitaxique de Composés Semiconducteurs par Évaporation-Diffusion en Régime Isotherme", 1 *Revue de Physique Appliquée* 11 (1966); both of which are hereby incorporated by reference. Thus, a structure such as that shown in FIG. 1 is achieved. The thickness of the substrate 12 may be, for example, 500 to 800 microns, and the thickness of the epitaxial layer 14 may be, for example, 10 to 30 microns. The thickness of the substrate 12 is not critical. The constraints on the thickness of the epitaxial layer 14 are determined by the desired thickness of the final HgCdTe layer beomg produced. To achieve good efficiency, the active layer of the device finally achieved (that is, the thickness of the layer of HgCdTe alloy which has the desired composition for infrared detection) should, at its thinnest, be at least one wavelength thick, at the maximum detectable wavelength. Thus, if the desired device is to be a detector operating at 10 microns, the active layer of the desired HgCdTe composition in the operating device should preferably be at least 10 microns thick, and thus the HgTe epitaxial layer which is originally deposited should be at least 8 microns thick. Because the lattice constants of all HgCdTe compositions are approximately equal, the thickness of the HgCdTe layer finally produced may be easily calculated in proportion to the initial layer of HgTe initially deposited. Thus, if a 20 micron layer of HgTe is initially deposited, and the illuminating wavelength is chosen to produce $Hg_{0.8}Cd_{0.2}Te$ (i.e. approximately 10 micron material) the final thickness will be 20 divided by 0.8, or 25 microns.

For convenience, the HgTe film which is deposited on the CdTe substrate has been referred to frequently in this disclosure as an epitaxial layer. However, a polycrystalline HgTe film, or even a polycrystalline film of a mercury-rich HgCdTe alloy may also alternatively be deposited.

In the presently preferred embodiment of the process of the present invention, a laser is used to provide IR illumination, and the laser light is applied in a series of relatively low-energy pulses. However, it is believed that cw illumination would be equally as effective, except that greater care is required to ensure that large scale melting does not occur.

To more clearly set forth the preferred embodiment, we shall suppose temporarily that it is desired to generate a detector which will operate at 10 microns. Thus, a 10.6 micron $CO_2$ laser may be used to provide the infrared illumination.

Figure 2:
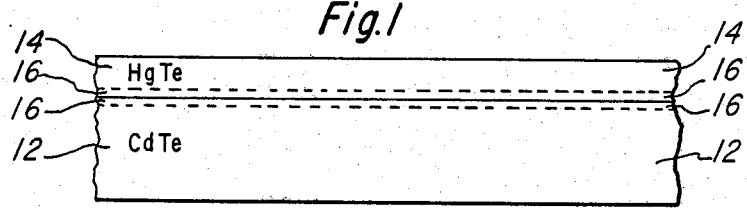
FIG. 2 is a cross sectional view of the structure of FIG. 1 being illuminated by infrared radiation, and indicates the region of localized heating.
Figure 3:
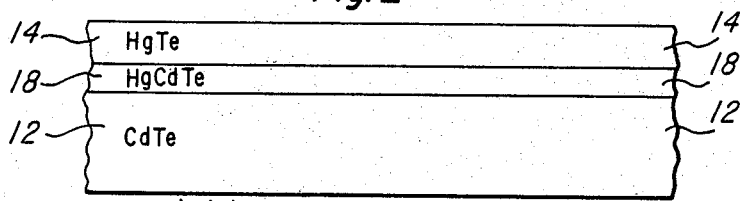
FIG. 3 is a cross sectional view of the device of FIGS. 1 and 2, after the localized heating of the HgTe/CdTe interface has produced a region of HgCdTe alloy.

Since CdTe has a relatively large band gap, it is transparent to light at wavelengths longer than about 0.83 microns. Thus, when infrared illumination is applied to the undersurface of the CdTe substrate, the distribution of light intensity will be as shown in FIG. 7a, where the light is unattenuated in the CdTe, but is rapidly attenuated above the CdTe/HgTe interface. Since most of the light absorption takes place within the HgTe near the interface, the distribution of localized temperature rise caused by the light absorption will be as shown in FIG. 7b. This very strong localized heating (of the region 16 shown in FIG. 2) produces a localized increase in the interdiffusion coefficient, as shown in FIG. 7c. Thus, a concentration of cadmium begins to diffuse into the HgTe layer, as shown in FIG. 7d, and a tapered band gap results, approximately as shown in FIG. 7e. Thus, a large-band-gap HgCdTe alloy 18 now exists at the former location of the HgTe/CdTe interface, as shown in FIG. 3.

Figure 4:
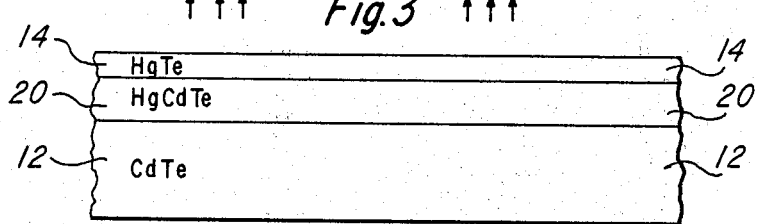
FIG. 4 is a cross sectional view of the device of FIG. 3, after further infrared illumination.

Thus, when a second laser pulse is applied, the pulse is unattenuated through the CdTe, and also through the region 18 of large-band-gap alloy which has now been created. When the second pulse encounters low-band-gap HgCdTe alloy and HgTe, this pulse too is rapidly attenuated, as shown by the light intensity plot of FIG. 8a. Thus, localized heating is again produced, as shown in FIG. 8b. However, note that the location of the localized heating has now been shifted toward the film/air interface. Diffusion coefficients are thus increased, as shown in FIG. 8c, and a further diffusion of cadmium into the former HgTe layer is caused, as shown in FIG. 8d. A larger layer 20 of HgCdTe alloy has now been produced as shown in FIG. 4. The resulting profile of band gap versus depth is approximately as shown in FIG. 8e, where it may been seen that successive laser pulses, by causing localized increases of diffusion, have caused a region of marginally transparent alloy (that is, HgCdTe alloy having a band gap just larger than the photon energy of the IR illumination applied) to progressively extend upward through the former HgTe layer.

Figure 5:
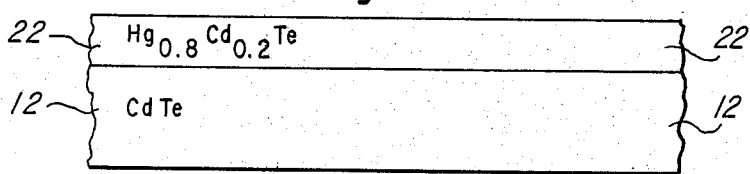
FIG. 5 shows a section of a finished device produced by the method of the present invention, with particular values of HgCdTe composition, corresponding to a particular wavelength of IR illumination, indicated.

Repeated application of laser pulses continues to cause this effect, until the last effective pulse causes parameter distribution as shown by the dotted curves in FIG. 8. After the last effective pulse, a small concentration of cadmium has been caused to diffuse throughout the former HgTe layer, and the band gap throughout the HgCdTe layer 22 (shown in FIG. 5) is now just barely above the photon energy of the IR illumination, as shown by the dotted curve in FIG. 8e.

The present process is self-limiting, as discussed above. However, while close monitoring of process completion is not required for reliable production, it is convenient for manufacturing control to know when the process has gone to completion, so that time is not wasted in further illumination of completed devices. Since the device becomes transparent to the IR illumination wavelength used when processing is completed, a simple luminance detector (e.g. a crude thermal detector,) may be used to detect completion of the illumination step of the process.

No doping is required in such a narrow-band-gap intrinsic material. However, it might be desirable to select a conductivity type, by means of doping or thermal processing, with regard to the type of carriers which would be generated by incident light, e.g. where a HgCdTe detector was to be embodied in a monolithic device including other electrical circuits.

At this point a minimally functional structure has been achieved, but additional processing steps will further improve the device characteristics. First, it should be noted that the dotted curves in FIGS. 8d and 8e are not quite constant within the former HgTe layer. However, the material at the surface has the narrowest band gap, and the rate of change of band gap with depth is small near the surface. In many applications such as IR imagers based on charge transfer devices, this slight gradation within the active layer will be unimportant.

Where a non-uniformity of band gap with depth is undesirable, there are at least two ways to avoid it: the simplest way is to use a two-step process. A process as described above is first applied, using an illumination wavelength which is much longer than that corresponding to the desired band gap. Thus, for example, if it were desired to produce a device operating at 4.5 microns, a 10.6 micron laser source might be used in a first step of illumination, as described above. A 5 micron source might then be used to cause a second step of interdiffusion. Since a smaller total redistribution of cadmium would be caused by this second step, a more uniform band gap within the active layer should result.

A further advantage of this two step process is that very economical sources of high power IR illumination (such as CO$_2$ or other cheap IR lasers) could be used for the first step, at one of a relatively small number of wavelengths selected in accordance with the final band gap desired, and a more expensive second source of illumination, at a more selectively determined frequency, could then be used to provide the final step of precise tailoring to the band gap desired.

Figure 6:
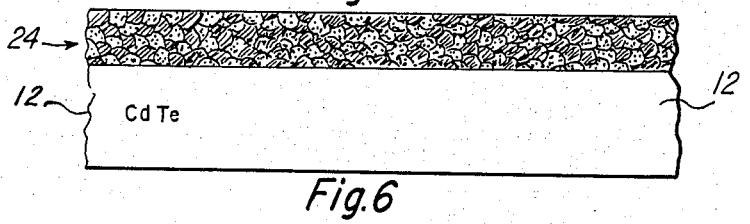
FIG. 6 is a cross sectional view of a device, to which the present invention is to be applied, comprising a sputtered film including HgTe and CdTe globules on top of a CdTe substrate.

A further answer to non-uniformity of the band gap is to initially provide some CdTe deposited on top of the HgTe layer, so that the CdTe constituent of the final active layer is not required to diffuse entirely through the HgTe layer. Thus, after the HgTe film has been deposited on top of the CdTe substrate layer, CdTe or a composite of CdTe globules and HgTe globules would be deposited atop the HgTe layer by sputtering. The laser illumination steps according to the present invention would then be applied to a structure such as that shown in FIG. 6.

A further embodiment of the present invention could be used to perform additional processing on HgCdTe alloys which have already been crudely prepared by known methods, such as liquid phase epitaxy. Thus, a thin layer of CdTe would be deposited on top of the conventionally-grown HgCdTe slice, and infrared illumination applied, as discussed above, through the CdTe layer, causing interdiffusion which would increase the band gap of the HgCdTe alloy to a uniform level.

One difficulty caused by the different interdiffusion rates of cadmium and mercury, in applying the process of the present invention, is that vacancy-rich regions are likely to be produced below the original HgTe/CdTe interface, and intestitial inclusions are likely to be produced above the HgTe/CdTe interface. Such defects can produce non-intrinsic regions, and may have undesirable effects on carrier mobility and lifetime. However, such defects can be greatly reduced simply by annealing the device after the interdiffusion process has gone to completion.

The above description of the presently preferred embodiment is based on the use of many low-energy laser pulses. For example, where a 20 micron HgTe film has been deposited on a 760 micron CdTe substrate, a pulse energy of less than 1 Joule per square centimeter can be applied, to a structure which was no hotter than 25° C., without raising the temperature above 575° C. outside the 3 micron thick absorption region. Since a pulse power of one to three Joules per square centimeter is within the range commonly used for laser annealing operations, a pulse power level of one Joule per square centimeter is quite compatible with existing equipment. However, to maximize production in a manufacturing environment, higher-energy laser pulses may be used, if careful attention is paid to thermal effects. Since the phase diagram of the HgCdTe is such that solidification is incongruent (that is, differential freezing takes place, as discussed above), it is prudent to avoid large scale melting. While localized melting may occur over a thickness of a few microns, such localized melting will be so quickly resolidified that the differential freezing effects are of slight inportance and such localized melting can perturb the composition of the alloy only over a small region. In addition, the deleterious effects of mercury distillation, as discussed above, must also be avoided. Thus large scale melting places one important constraint on acceleration of the process according to the present invention. However, there is no corresponding lower limit on the speed with which the process of the present invention must be completed (that is, on the power of the pulses used). The existing published study on the interdiffusion of mercury and cadmium refers to a temperature of around 550° (see L. Svob et al, "Influence of the Mercury Vapor Pressure on the Isothermal Growth of HgTe over CdTe", 46 J. Appl. Phys. 4251 (1975), which is hereby incorporated by reference), but there is no reason to believe that the same differential interdiffusion effect would not also obtain at lower temperatures. Thus, by keeping the pulse energy relatively low (e.g. less than 1 Joule per square centimeter, as discussed above), and by allowing time for thermal relaxation and cooling between pulses, the undesirable effects of large scale melting are reliably avoided.

The melting point of HgTe is in the neighborhood of 670° C., the melting point of CdTe is in the neighborhood of 1090° C., and the melting point of the various HgCdTe compositions varies smoothly between the two temperatures. Thus, when differential solidification takes place, the higher-melting-temperature alloys, which will tend to freeze out first, are in this system the cadmium-rich alloys. This effect can also be applied advantageously in the present invention, since, if cooling is applied primarily to the upper surface of the HgTe layer, the cadmium-rich alloys, which will tend to freeze out first, will be preferentially deposited near the upper surface of the metal zone. Thus migration of cadmium across the melted zone into the former HgTe layer, as desired, will be greatly accelerated. Such accelerated transfer of cadmium might be used, for example, by applying a first high-energy pulse to cause melting over a relatively thick layer (on the order of tens of microns thick), as long as the melted region did not extend to the top surface of the HgTe film. Low-power pulses, as discussed above, could then be successively applied to attain a homogenous HgCdTe composition as discussed above.

To support the structure while it is being illuminated, it is simply positioned over a hole in a carrier. Alternatively, a carrier comprising windows of an infrared-transparent material, such as germanium, can be used. Alternatively, the upper surface of the structure, where the HgTe has been deposited, can be bonded to a carrier, without other support for the substrate. This structure would also provide desirable thermal sinking through the upper surface of the device.

When such cooling through the HgTe layer is desired, or in general to facilitate manipulation of the devices being prepared, the HgTe surface of the device can be bonded to a simple thermal sink, e.g. by applying a thick layer of photoresist to the surface.

While it would also be possible to apply simple cw illumination in practicing the present invention, use of cw illumination would be much more conducive to large scale melting, since thermal relaxation would produce widespread, rather than localized, heating. Where a cw laser is the most convenient power source, the laser may simply be scanned across the device, or even chopped, to produce an effect similar to that of a pulse laser. A minor difficulty in use of a sharply collimated scanning cw laser, however, is that small lateral migration effects may be produced between heated and adjacent nonheated areas, so that the device finally produced is not perfectly laterally uniform as might be desired. However, this effect should be minor. When it is necessary to minimize this effect, it is possible to use a two stage process, as discussed above, where the first step comprises scanning with a high-power cw laser, and the second step comprises uniform illumination with a shorter-wavelength decollimated source.

The desirably wavelength-selective properties of the process of the present invention may also be employed, by using an additional patterning step, to produce a two-color (or multi-color) infrared detector. Thus, the process of the present invention would first be applied to produce a uniform device capable of operating at the longest of the multiple wavelengths which it is desired to detect. Next, irradiation is again applied at the next shorter of the desired wavelengths, but this second step of irradiation is applied only to selected areas of the device. The selected areas may be patterned in accordance with the desired final configuration of the respective elements for detecting various colors. Subsequent irradiation steps may be applied to successively smaller areas of the substrate, at successively shorter wavelengths, until the desired configuration of color detectors is finally produced. Of course, to actually generate a functional multi-color device, appropriate isolation will have to be provided between the pixels operating at different colors; but the present invention is believed to provide the first practical means for generating a film having a desired pattern of areas having different bandgaps.

It will be obvious to those skilled in the art that further modifications and variations may be introduced, without affecting the scope of the inventive concepts disclosed and claimed by the present invention.

What is claimed is:

1. A process for forming an alloy of mercury, cadmium, and tellurium, having a desired bandgap, comprising the steps of:
   providing a CdTe substrate;
   depositing a layer of HgTe on said CdTe substrate;
   illuminating said CdTe substrate, through a surface of said CdTe substrate on which said layer of HgTe was not deposited, with infrared light having a wavelength longer than that which corresponds to the bandgap of the desired alloy of mercury, cadmium, and tellurium.

2. The process of claim 1, wherein said illuminating step applies laser light.

3. The process of claim 2, wherein said laser light is applied intermittently.

4. The process of claim 3, wherein each said intermittent application of said laser light applies energy not greater than one Joule per square centimeter.

5. The process of claim 4, wherein said intermittent illumination is provided by a cw laser which is scanned across said substrate.

6. The process of claim 4, wherein said intermittent illumination is provided by a decollimated pulsed laser.

7. The process of claim 4, wherein the first one of said intermittent applications of light comprises a higher power than later ones of said applications of said light.

8. The process of claim 1, wherein said HgTe layer is an epitaxial crystalline layer.

9. The process of claim 1, wherein said HgTe layer is a polycrystalline layer.

10. The process of claim 1, wherein said HgTe layer also comprises an admixture of HgCdTe.

11. The process of claim 1, further comprising a second step of illumination, said second step comprising:
    illuminating said substrate, from the surface of said substrate to which said HgTe layer was not applied, said second illuminating step applying light of a wavelength which is shorter than the wavelength of said light applied by said first illuminating step.

12. The process of claim 11, wherein said second illuminating step applies laser light.

13. The process of claim 12, wherein said second illuminating step is applied only to selected portions of said substrate, said selected portions of said substrate being configured in a desired pattern.

* * * * *